(12) United States Patent
Panitz et al.

(10) Patent No.: US 12,642,059 B2
(45) Date of Patent: May 26, 2026

(54) METHOD OF PRODUCING AN ETCHING MASK, METHOD OF ETCHING A STRUCTURE INTO A SUBSTRATE, USE OF A TETREL LAYER AND STRUCTURE FOR PRODUCING A MASK

(71) Applicant: JENOPTIK Optical Systems GmbH, Jena (DE)

(72) Inventors: Meik Panitz, Jena (DE); Lutz Raupach, Jena (DE); Martin Tilke, Jena (DE); Sabine Zybell, Jena (DE)

(73) Assignee: Jenoptik Optical Systems GmbH, Jena (DE)

( * ) Notice: Subject to any disclaimer, the term of this patent is extended or adjusted under 35 U.S.C. 154(b) by 235 days.

(21) Appl. No.: 18/574,802

(22) PCT Filed: Jun. 20, 2022

(86) PCT No.: PCT/EP2022/066735
§ 371 (c)(1),
(2) Date: Dec. 28, 2023

(87) PCT Pub. No.: WO2023/274771
PCT Pub. Date: Jan. 5, 2023

(65) Prior Publication Data
US 2024/0304446 A1      Sep. 12, 2024

(30) Foreign Application Priority Data

Jun. 28, 2021      (DE) ..................... 10 2021 116 587.3

(51) Int. Cl.
H10P 76/40          (2026.01)
H10P 50/00          (2026.01)
(Continued)

(52) U.S. Cl.
CPC ........ H10P 76/4085 (2026.01); H10P 50/242 (2026.01); H10P 50/692 (2026.01);
(Continued)

(58) Field of Classification Search
None
See application file for complete search history.

(56) References Cited

U.S. PATENT DOCUMENTS 4,479,850 A      10/1984  Beinvogl et al.
5,001,085 A      3/1991   Cathey et al.
(Continued)

FOREIGN PATENT DOCUMENTS

DE          33 15719 A1      10/1984
DE          103 55 581 A1      6/2005
(Continued)

*Primary Examiner* — Binh X Tran
(74) *Attorney, Agent, or Firm* — Muncy, Geissler, Olds & Lowe, P.C.

(57)          ABSTRACT

A method of producing an etching mask. A substrate is provided, a metal layer is applied, the metal layer comprises or is formed from at least one transition metal and/or aluminum. A masking layer is applied and the masking layer is structured. The metal layer is exposed in at least one processing region. The substrate is coated with a tetrel layer including at least partially a tetrel, wherein an interdiffusion zone between the transition metal or aluminum and the tetrel is formed in the processing region at an interface between the metal layer and the tetrel layer. The masking layer is removed and the metal layer s selectively etched. The substrate is exposed in at least one etching region other than the processing region, and the metal layer is at least partially maintained in the processing region.

14 Claims, 7 Drawing Sheets

(51) Int. Cl.
    *H10P 50/24*          (2026.01)
    *H10P 76/20*          (2026.01)
(52) U.S. Cl.
    CPC .......... *H10P 50/695* (2026.01); *H10P 76/204*
                    (2026.01); *H10P 76/405* (2026.01)

(56)                  References Cited

U.S. PATENT DOCUMENTS 5,053,105  A  *  10/1991  Fox, III  .............. H01L 21/3081
                                                        257/E21.232
      5,906,950  A      5/1999  Keller et al.
      6,261,938  B1 *   7/2001  Beauvais  ............. G03F 7/0002
                                                        438/607
      7,151,055  B2    12/2006  Aminpur et al.
  2002/0177280  A1    11/2002  Schoenborn
  2004/0023502  A1     2/2004  Tzou et al.
  2004/0178476  A1     9/2004  Brask et al.
  2015/0380259  A1 *  12/2015  Chang ................ H01L 21/0337
                                                        438/702
  2022/0384642  A1 *  12/2022  Shu ................... H10D 84/0149

FOREIGN PATENT DOCUMENTS

EP          0 284 308  A1    9/1988
  JP          H 06-61000  B2    8/1994
  JP          2007-115830  A    5/2007
  WO          WO 00/17710  A1    3/2000

* cited by examiner 400 320 310

305

300

400 325

400 335 325 340

330

1000

1100

METHOD OF PRODUCING AN ETCHING MASK, METHOD OF ETCHING A STRUCTURE INTO A SUBSTRATE, USE OF A TETREL LAYER AND STRUCTURE FOR PRODUCING A MASK

CROSS REFERENCE TO RELATED APPLICATIONS

This nonprovisional application is a National Stage of International Application No. PCT/EP2022/066735, which was filed on Jun. 20, 2022, and which claims priority to German Patent Application No. 10 2021 116 587.3, which was filed in Germany on Jun. 28, 2021, and which are both herein incorporated by reference.

The present approach relates to a method of producing an etching mask, a method of etching a structure into a substrate, a use of a tetrel layer and a structure for producing a mask.

Lithography of titanium, aluminum and tungsten layers is a widely used standard technology for many standard CMOS products. Lithography of chromium layers is a widely used standard technology for many non-CMOS standard products as optical absorbers for a broad wavelength spectrum. Structuring technologies such as electron beam lithography or optical lithography have been known in micro- and nanotechnology for years. The same applies to coating processes such as sputter deposition (sputter coating) of chromium and, in some cases, silicon. Dry etching processes are used, for example, in the photomask industry, where reactive ion etching of chromium and chromium oxynitride layers with chlorine-based plasma has been a common method for many years.

PRIOR ART

An etching process with a silicide mask is known from JP H06-061 000 B2. Another etching process with a silicide mask is known from JP 2007-11 5830 A. A silicide film is known from U.S. Pat. No. 5,906,950 A. Another etching process with a silicide mask is known from U.S. Pat. No. 5,001,085 A. Another etching process with a silicide mask is known from EP 0 284 308 A1. Another etching process with a silicide mask is known from DE 3 315 719 A1. A method for producing an etching mask is known from U.S. Pat. No. 5,053,105 A. The production of an electrode by means of an etching process is known from US 2002/0 177 280 A1. Another method for producing a gate electrode using an etching process is known from DE 10 355 581 A1. The etching processes mentioned all have the disadvantage that it is difficult to etch narrow trenches.

DISCLOSURE OF THE INVENTION

Against this background, the present approach presents a method of producing an etching mask, a method of etching a structure into a substrate, a use of a tetrel layer and a structure for producing a mask in accordance with the main claims. Advantageous embodiments result from the respective dependent claims and the following description.

The method presented herein advantageously enables a tonality reversal without changing an expensive photomasking or painting process. In addition, the shading and loading effect of resist edges can be reduced. In addition, resist bars can be produced at positions where substrate trenches are created, which can be narrower than the resolution limit of the lithography system.

A method of producing an etching mask is presented, the method comprising the following steps:
- providing a substrate,
- applying a metal layer with a metal layer thickness to the substrate, wherein the metal layer comprises at least one transition metal and/or aluminum or is formed from such a metal,
- applying a masking layer with a masking layer thickness to the substrate coated with the metal layer,
- structuring the masking layer, wherein the metal layer is exposed in at least one processing region,
- subsequently coating the substrate with a tetrel layer having a tetrel layer thickness, with the tetrel layer including at least partially a tetrel, wherein an interdiffusion zone between the transition metal or aluminum and the tetrel is formed at the processing region at an interface between the metal layer and the tetrel layer,
- removing the masking layer, and
- selectively etching the metal layer, wherein the substrate is exposed in at least one etching region other than the processing region, and the metal layer is at least partially maintained in the processing region.

In particular, the tetrel layer may comprise silicon or be formed from silicon and the interdiffusion zone may be present as a transition metal silicide layer or an aluminum silicide layer.

In the step of providing, the substrate can be provided, for example, as a so-called wafer made of glass, quartz glass, silicon, a polymer or other materials. Subsequently, the metal layer is applied to at least one side of the substrate, which can be formed from chromium, for example. In particular, the metal layer may comprise several or exactly one transition metal and/or consist of several or exactly one transition metal. Suitable transition metals can be the chemical elements with atomic numbers from 21 to 30, 39 to 48 and 57 to 79. Advantageously, several of these or a base transition metal may be selected. A metal whose redox pairs have a negative standard potential with respect to the standard hydrogen electrode can be described as base metal. The metal layer can particularly advantageously comprise several or exactly one refractory metal, for example Ti, Cr, Mo and/or W, or consist of several or exactly one refractory metal. Also advantageously, the metal layer may comprise or consist of aluminum.

The side of the substrate covered by the metal layer is coated with the masking layer (also known as resist) in the step of applying, which can be a photoresist, for example. In the step of structuring, the masking layer is structured, for example by exposing the photoresist. The masking layer is completely removed in at least one processing region, which can also be referred to as the first location, so that the underlying metal layer is exposed. Subsequently, the side of the substrate on which the metal layer and the masking layer are arranged is then additionally coated with a tetrel layer. A tetrel is an element of the fourth main group of the periodic table of elements, also known as the carbon group, i.e., group 14 of the current IUPAC notation. Advantageous tetrels in the context of the invention can be, for example, carbon (C), silicon (Si) or germanium (Ge), particularly advantageously Si. The use of Si or C as a tetrel can be particularly advantageous if the metal layer is formed from a base metal, advantageously for example a refractory metal or aluminum. Alternatively, a precious transition metal, such as gold, can be used for the metal layer. Germanium, for example, can then be selected as the tetrel, which can form a gold-germanium alloy at the interface in the interdiffusion zone. A tetrel layer may be such a layer comprising at least one tetrel, advantageously consisting of one tetrel and particularly advantageously consisting of exactly one tetrel. Semi-metallic tetrels and non-metallic tetrels may be particularly suitable, while metallic tetrels may be unsuitable. At the processing region where the metal layer is exposed due to the previous structuring, an interdiffusion zone is created between the tetrel and the metal layer. This interdiffusion zone can occur at an interface between the metal layer and the tetrel layer and can form between the tetrel of the tetrel layer and the metal of the metal layer. For example, a metal silicide layer, i.e., a transition metal silicide layer or aluminum silicide layer, can be formed if silicon is selected as the tetrel. The interdiffusion zone can also be referred to as a transition zone in which the metal of the metal layer and the tetrel can be mixed. Mixed can be understood to mean that an alloy can be present in this transition zone. The alloy may comprise one or more intermetallic mixed phases. When the masking layer is subsequently removed, the metal layer coated with the tetrel layer, or the transition metal silicide layer, remains in the processing region. In the following step of selectively etching, the metal layer can be removed in the regions that are not coated with the tetrel layer. Thus, the substrate is exposed in an etching region, while the substrate arranged at the processing region is passivated by the interdiffusion zone. This takes advantage of the fact that alloys such as chromium silicide can differ greatly in their etching behavior from pure chromium and also from pure silicon. This also applies to contact regions such as the interdiffusion zones of two successively deposited layers. Such interdiffusion zones can be very thin, for example in the order of one nanometer, and yet very resistant to certain etching processes. With the method presented herein, such a thin interdiffusion zone can be used to advantageously overcome some intrinsic difficulties in lithography. The process sequence allows a positive-negative inversion, i.e., a tonality reversal, without changing the exposure masks used or creating a new photomask. Furthermore, a change in tonality can help to resolve some specific difficulties in lithography. Assuming a positive tone resist and a given distance are used to resolve a test grid, it is usually easier to realize fine resist lines that are less than 50% of the distance, as this can be tuned by some overdosing during exposure or over-development to reduce the width of the resist strips, and sometimes the height of the resist. Nevertheless, the closer you get to the resolution limit of a lithography system, the more difficult it becomes to resolve resist grooves that are smaller than 50% of the distance of the test grid. With the method presented herein, trenches smaller than 50% of the distance can advantageously be resolved. This could enable i-line litho production of pulse compression gratings in the future. In addition, this method can also be used to produce effective media, such as optically effective media, from non-effective media by structuring, for example chemically resistant AR layers or index gradients. The present invention can be used for producing products with CMOS technology and with other technologies.

According to one embodiment, the method may comprise a step of removing the tetrel layer, wherein the interdiffusion zone may remain at the processing region, wherein the removal of the tetrel layer may take place after the step of coating and before the step of removing. Additionally or alternatively, the tetrel layer can be at least partially removed in the step of removing the masking layer. For example, the tetrel layer and additionally or alternatively the masking layer with the tetrel layer can be removed by an etching process. The step of removing may differ from conventional lift-off processes, as the tetrel layer can be selectively removed from the resist strip. The advantage of this is that no silicon flakes or fences remain.

According to a further embodiment, the tetrel layer can be removed by wet chemical means using potassium hydroxide (KOH) and additionally or alternatively sodium hydroxide (NaOH) and additionally or alternatively ammonium hydroxide ($NH_4OH$) and additionally or alternatively an organic basic etching agent. Using these or similar etching agents has the advantage that the step of removing can be carried out cost-effectively.

According to a further embodiment, in the step of structuring, the masking layer can be structured by exposing and developing and additionally or alternatively by means of an electron beam. For example, the masking layer can be a positive resist or a negative resist. These can be exposed in the step of structuring using an exposure mask, for example, and then developed. Advantageously, such a method step can be performed cost-effectively. Optionally, structuring can also be performed by means of electron beam lithography. The main advantage of using an electron beam is that structures can be produced with significantly smaller dimensions, for example in the nanometer range, compared to photolithography.

According to a further embodiment, in the step of removing, the masking layer can be removed by ashing and additionally or alternatively wet-chemically and additionally or alternatively by dissolving in a solvent and additionally or alternatively by a combination of dissolving and chemical removal. Additionally or alternatively, in the step of selectively etching, etching of the metal layer can be carried out by means of reactive ion beam etching (RIE) and additionally or alternatively non-reactive ion beam etching and additionally or alternatively wet-chemically with an acidic and additionally or alternatively halogen-containing etching agent. The agent used in the process of removing and when selectively etching can be matched to the materials of the masking layer and the metal layer. Advantageously, the method can be optimally adapted to the given circumstances and the solvents and materials available for the method.

According to a further embodiment, in the step of applying, the metal layer may consist of titanium (Ti), zirconium (Zr), tantalum (Ta), chromium (Cr), molybdenum (Mo) and additionally or alternatively tungsten (W) or comprise at least one of these metals. Additionally or alternatively, in the step of providing, the substrate can be provided as a wafer made of glass, quartz glass, quartz single crystal, silicon (Si), germanium (Ge), BiTe, gallium arsenide (GaAs), silicon carbide (SiC), indium phosphide (InP), GaInAsP, lithium niobate (LiNbO3) or a polymer. The materials used can be advantageously adapted to the existing requirements.

According to a further embodiment, the metal layer thickness may be between 1 nm and 2000 nm and additionally or alternatively the masking layer thickness may be between 1 nm and 500 nm and additionally or alternatively the tetrel layer thickness may be between 1 nm and 30 nm, in particular between 1 nm and 5 nm and 1 nm and 2 nm. For example, the metal layer thickness as well as the masking layer thickness may be, for example, between 20 nm and 200 nm. This advantageously allows a common obstacle to the structuring of chromium layers to be overcome with high resolution. The high aspect ratio of the resist can sometimes be a hindrance when structuring in this way, particularly with fine features. For example, a 300 nm thick resist layer can be used to structure a 100 nm thick Cr layer. To dissolve 100 nm grooves, etching can be carried out in resist cavities that are three times as deep as they are wide. This is not the only reason for a size-dependent etching depth or a size-dependent undercut (RIE lag), but it is an important one. The method presented herein can advantageously be used to produce a thinner etching mask, for example in the order of one or two nanometers. This can greatly reduce effects such as shading or the so-called loading effect of the resist side walls. Furthermore, stress can be avoided by introducing dense properties into the substrate. This can be an advantage compared to alternative coatings with functional layers, particularly for products that are sensitive to bending.

In an advantageous embodiment, the tetrel layer can be applied so thinly that the applied tetrel is completely absorbed into the interdiffusion zone at the processing regions. Then the surface there can be free of pure tetrel.

According to a further embodiment, in the step of applying, the metal layer can be applied by means of sputtering or vapor deposition and, additionally or alternatively, in the step of coating, the substrate can be coated with the tetrel layer by means of sputtering or vapor deposition. Advantageously, time and costs can be saved by using such known methods.

According to a further embodiment, the method may comprise a step of cleaning the surface of the exposed processing region, wherein the step of cleaning may be performed after the step of structuring and before the step of coating. For example, cleaning can be carried out by means of dry etching, in particular sputter etching or plasma etching or plasma-free thermal gas etching. Advantageously, in the step of cleaning, a surface of the structured masking layer and the metal layer exposed by structuring can be optimally prepared for coating with the tetrel layer.

In addition, a method of etching a structure into a substrate is presented, wherein the method comprises a step of producing an etching mask according to a variant of the method presented above and a step of deep etching into the substrate using the etching mask. Advantageously, by using an etching mask produced according to the production method presented above, all of the aforementioned advantages can be optimally realized.

For example, the structure etched into the substrate may have fine $SiO_2$ pillar arrays with high resolution and low exposure costs. These could be advantageous for optical immersion sensors or as metamaterials with a specific refractive index, for example. A very thin hydrophobic coating over these pillars can create a lotus effect in order to make surfaces extremely hydrophobic. The pillars can, for example, be made of pure $SiO_2$ and be highly resistant to degeneration caused by UV radiation and corrosion.

According to one embodiment, deep etching into the substrate can be carried out by means of reactive ion etching (RIE) or reactive ion deep etching (DRIE). Advantageously, deep etching can thus be performed with a high degree of controllability with regard to homogeneity, etching rate, etching profile and selectivity, for example for the production of topographic structures for micro- and nanosystem technology.

Advantageously, removing the etching mask may also be provided. Removing the etching mask may comprise removing the interdiffusion zone and the metal layer remaining under the interdiffusion zone. The structure etched into the substrate can be maintained. The substrate with the etched structure can then be free of the metal layer. This can be particularly advantageous if an optical component is to be produced. Removing the etch mask can be carried out simultaneously with deep etching into the substrate and/or after deep etching into the substrate. The etching mask can advantageously be removed after deep etching. It is also advantageous to already start removing the etching mask during deep etching. For example, the interdiffusion zone can be partially or completely removed during deep etching. Advantageously, at least part of the metal layer can be maintained until the end of deep etching, so that masking is ensured until the end of deep etching.

In addition, a use of a tetrel layer when producing an auxiliary mask inverted with respect to a resist mask on a metal layer for masking this metal layer is presented, the metal layer comprising a transition metal and/or aluminum and the auxiliary mask being formed from an alloy of the tetrel with the metal, in particular from a metal silicide. The alloy can be present in an interdiffusion zone at an interface between the metal layer and the tetrel layer.

The metal layer can advantageously consist of the transition metal or aluminum. A metal layer consisting of a single metal can have the advantage that it can be produced in a more reproducible way.

In addition, a structure for producing a mask is presented, the structure comprising a substrate, a continuous metal layer of at least one transition metal or aluminum arranged on the substrate, a structured masking layer arranged on the metal layer with at least one processing region at which the masking layer is interrupted, wherein the metal layer is covered on the surface of the processing region with an interdiffusion zone which comprises an alloy of the transition metal or aluminum with a tetrel, in particular wherein the alloy comprises silicon. Material of the metal layer, which is not alloyed with tetrel, can be arranged between the interdiffusion zone and the substrate. This material can represent a tetrel-free portion of the metal layer in the processing region. This can make up the largest proportion of the layer thickness, while the layer thickness of the interdiffusion zone can be less than 10%, advantageously less than 2% of the total layer thickness of alloyed and tetrel-free layer thickness. For example, the layer thickness of the interdiffusion zone can be between 1 nm and 10 nm, advantageously between 1 nm and 5 nm, and particularly advantageously between 1 nm and 3 nm. Advantageously, the interdiffusion zone can therefore only be formed on the surface of the metal layer, while the metal layer inside and outside the processing region can have a substantially uniform layer thickness. An alloy of the metal with the Tetrel formed in the interdiffusion zone can only be present in the interrupted locations of the masking layer. At the uninterrupted locations, i.e., outside the processing regions, the masking layer can be arranged directly on the metal layer, while there is no material of the masking layer in the processing regions. A structure for producing a mask can be understood as a semi-finished product with which a mask can be produced. The mask can be made from the structure for producing a mask by removing the masking layer. This mask can be regarded as an auxiliary mask inverted with respect to the masking layer. The mask made from this semi-finished product can be used to etch a structure into the substrate in order to produce the desired product.

The methods presented can be implemented in software or hardware, for example, or in a hybrid form of software and hardware, for example in a control unit.

The approach presented here also creates a device that is designed to carry out, control, or implement the steps in corresponding devices in a variant of a method presented here. This embodiment variant of the invention in the form of a device can enable the object underlying the invention to be solved quickly and efficiently.

For this purpose, the device can have at least one computing unit for processing signals or data, at least one storage unit for storing signals or data, at least one interface to a sensor or an actuator for reading sensor signals from the sensor or for outputting data or control signals to the actuator, and/or at least one communication interface for reading or outputting data that are embedded in a communication protocol. The computing unit can, for example, be a signal processor, a microcontroller, or the like, wherein the memory unit can be a flash memory, an EEPROM, or a magnetic memory unit. The communication interface can be designed to read or output data wirelessly and/or in a line-bound manner, wherein a communication interface that can read or output line-bound data can, for example, read these data electrically or optically from a corresponding data transmission line or output them into a corresponding data transmission line.

In the present case, a device can be understood to mean an electrical device that processes sensor signals and as a function thereof outputs control and/or data signals. The device may have an interface, which may be designed as hardware and/or software. In a hardware embodiment, the interfaces can, for example, be part of a so-called system ASIC, which includes a wide variety of functions of the device. However, it is also possible for the interfaces to be separate integrated circuits or at least partially consist of discrete components. In a software design, the interfaces may be software modules which, for example, are present on a microcontroller in addition to other software modules.

Exemplary embodiments of the approach presented here are shown in the drawings and explained in more detail in the following description. Shown are:

FIG. 1 a flowchart of an exemplary embodiment of a method of producing an etching mask;

FIG. 2 a flowchart of an exemplary embodiment of a method of producing an etching mask;

FIG. 3 a schematic representation of an exemplary embodiment of various process steps in the method of producing an etching mask compared to conventional process steps;

FIG. 4 a schematic representation of a structure for producing an etching mask before applying the tetrel layer;

FIG. 5 a schematic representation of a structure for producing an etching mask after applying the tetrel layer;

FIG. 6 a schematic representation of a structure for producing an etching mask at the stage of an auxiliary mask;

FIG. 7 a schematic representation of the etching mask produced;

FIG. 8 a schematic representation of a structure etched into a substrate by means of the etching mask;

FIG. 9 a perspective top view of a structure etched into a substrate compared to another structure etched into a substrate;

FIG. 10 a flowchart of an exemplary embodiment of a method for etching a structure into a substrate;

FIG. 11 a block diagram of an exemplary embodiment of a device for controlling a method for etching a structure into a substrate; and FIG. 12 a schematic representation of an exemplary embodiment of various process steps in the method of producing an etching mask.

In the following description of advantageous exemplary embodiments of the present invention, the same or similar reference characters are used for the elements that are shown in various figures and having a similar effect, wherein a repeated description of these elements is dispensed with.

Figures 1, 2:
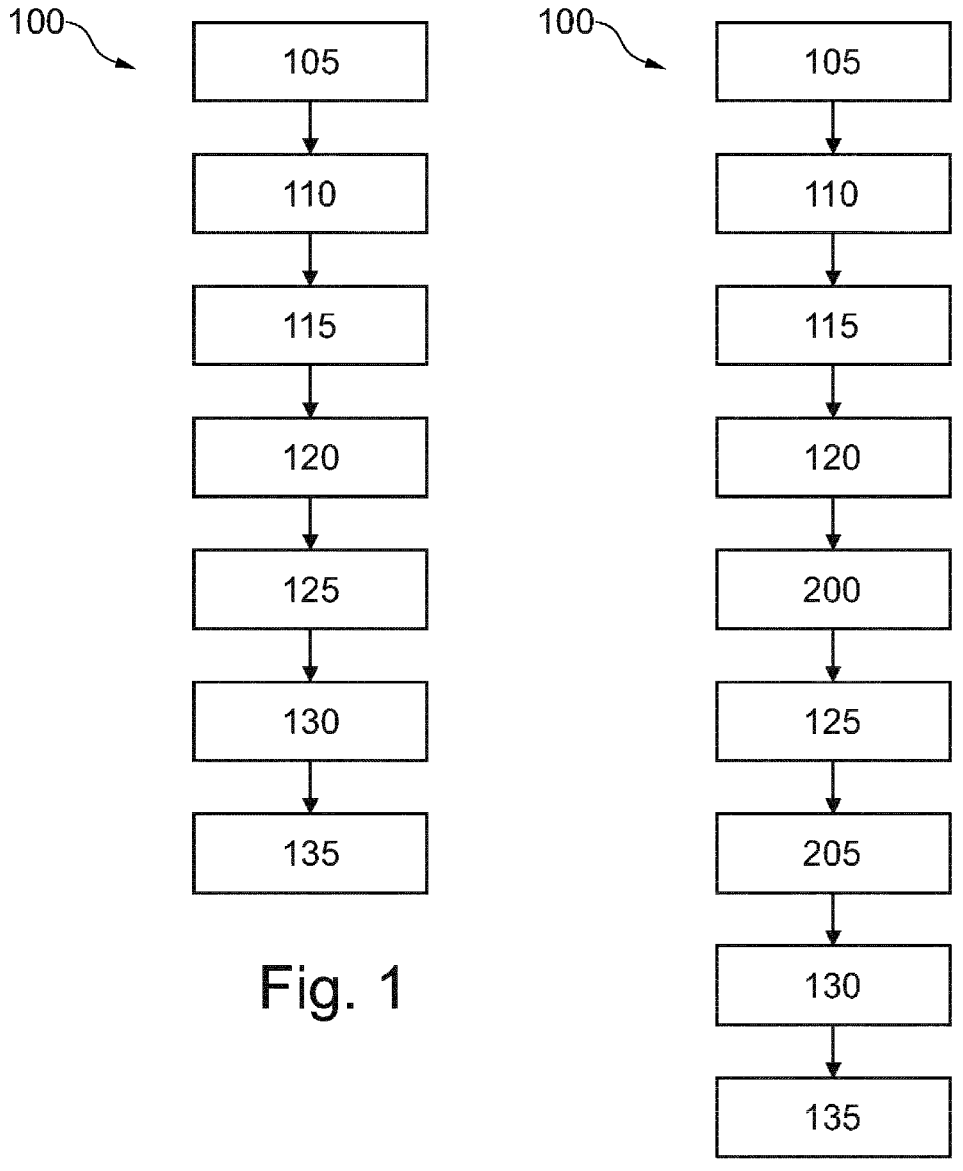

FIG. 1 shows a flowchart of an exemplary embodiment of a method 100 of producing an etching mask. The method 100 comprises a step 105 of providing a substrate, which is merely by way of example a wafer of silicon carbide. In another exemplary embodiment, the substrate can also be formed with glass, quartz glass, quartz single crystal, silicon (Si), germanium (Ge), BiTe, gallium arsenide (GaAs), indium phosphide (InP), GaInAsP or a polymer.

The step 105 of providing is followed by the step 110 of applying a metal layer to the substrate, the metal layer comprising a transition metal or aluminum, which in this exemplary embodiment is chromium (Cr). In another exemplary embodiment, the metal layer can also be formed from titanium (Ti), zirconium (Zr), tantalum (Ta), molybdenum (Mo) and additionally or alternatively tungsten (W) and additionally or alternatively aluminum, or comprise at least one of these metals. Merely by way of example, the metal layer in this exemplary embodiment has a metal layer thickness of 30 nm. In other exemplary embodiments, the metal layer thickness can be between 1 nm and 200 nm. In this exemplary embodiment, the metal layer is applied by means of vapor deposition. In other exemplary embodiments, the metal layer can also be applied by means of sputtering.

This is followed by a step 115 of applying a masking layer to the substrate coated with the metal layer. In this exemplary embodiment, a photoresist layer with, merely by way of example, a positive resist is used as the masking layer, the masking layer, merely by way of example, having a masking layer thickness of 100 nm. In another exemplary embodiment, the masking layer thickness can be between 1 nm and 500 nm.

The masking layer is structured in the following step 120 of structuring the masking layer, with the metal layer being exposed at a processing region. In this exemplary embodiment, 120 of structuring is carried out by means of exposing and developing the positive resist layer. In another exemplary embodiment, structuring can also be performed by means of an electron beam.

In the subsequent step 125 of coating, the substrate is coated with a tetrel layer, the tetrel layer in this exemplary embodiment being formed from silicon. In another exemplary embodiment, the tetrel layer may additionally or alternatively contain other elements of the IV. main group and additionally or alternatively be formed only partially from silicon. In this exemplary embodiment, the tetrel layer merely by way of example has a tetrel layer thickness of 6 nm and is applied by means of sputtering. In another exemplary embodiment, the tetrel layer can have a thickness of between 1 nm and 30 nm and can be applied by means of vapor deposition. In step 125 of coating, an interdiffusion zone between the transition metal or aluminum and the tetrel is formed at the processing region at an interface between the metal layer and the tetrel layer. In this exemplary embodiment, a transition metal silicide layer of merely $Cr_3Si$ is formed. In other exemplary embodiments, TiSi, $TiSi_2$, $Ti_5Si_4$, $Ti_5Si_3$, $ZrSi_2$, $Zr_3Si_2$, $Zr_3Si$, $Zr_5Si_4$, $TaSi_2$, $Ta_5Si_3$, $Cr_5Si_3$, CrSi, $CrSi_2$, $MoSi_2$, $Mo_3Si$, $Mo_5Si_3$, $WSi_2$ or $W_5Si_3$ or $Al_xSi_y$, can also form at the interdiffusion zone.

This is followed by a step 130 of removing the masking layer, wherein in this exemplary embodiment the tetrel layer is also at least partially removed. However, the interdiffusion zone remains. Merely by way of example, removing the masking layer is carried out by means of dissolving it in a solvent. In other exemplary embodiments, the step of removing can also be carried out by ashing and additionally or alternatively wet-chemically and additionally or alternatively by a combination of dissolving and chemical removal.

After removing the masking layer, a step 135 of selectively etching the metal layer follows, wherein the substrate is exposed in at least one etching region other than the processing region, and the metal layer is at least partially maintained in the processing region. In this exemplary embodiment, the step 135 of selectively etching is performed merely by way of example by means of reactive ion beam etching (RIE). In another exemplary embodiment, non-reactive ion beam etching may additionally or alternatively be used. Optionally, the selectively etching can also and additionally or alternatively be carried out wet-chemically with an acidic and additionally or alternatively halogen-containing etching agent.

FIG. 2 shows an exemplary embodiment of a method 100 of producing an etching mask. The method 100 shown herein corresponds to or is similar to the method described in the previous figure, with the difference that it has additional steps. Thus, in this exemplary embodiment, the step 120 of structuring the masking layer is followed by a step 200 of cleaning the surface of the exposed processing region. Only after cleaning is the step 125 of coating the substrate with the tetrel layer performed in this exemplary embodiment.

Merely by way of example, the step 125 of coating is followed in this exemplary embodiment by a step 205 of removing the tetrel layer. The interdiffusion zone remains in the processing region. In this exemplary embodiment, the tetrel layer is removed wet-chemically using potassium hydroxide (KOH). In another exemplary embodiment, the step of removing may additionally or alternatively be carried out using sodium hydroxide (NaOH) and additionally or alternatively using ammonium hydroxide (NH$_4$OH) and additionally or alternatively using an organic basic etching agent.

Figure 3:
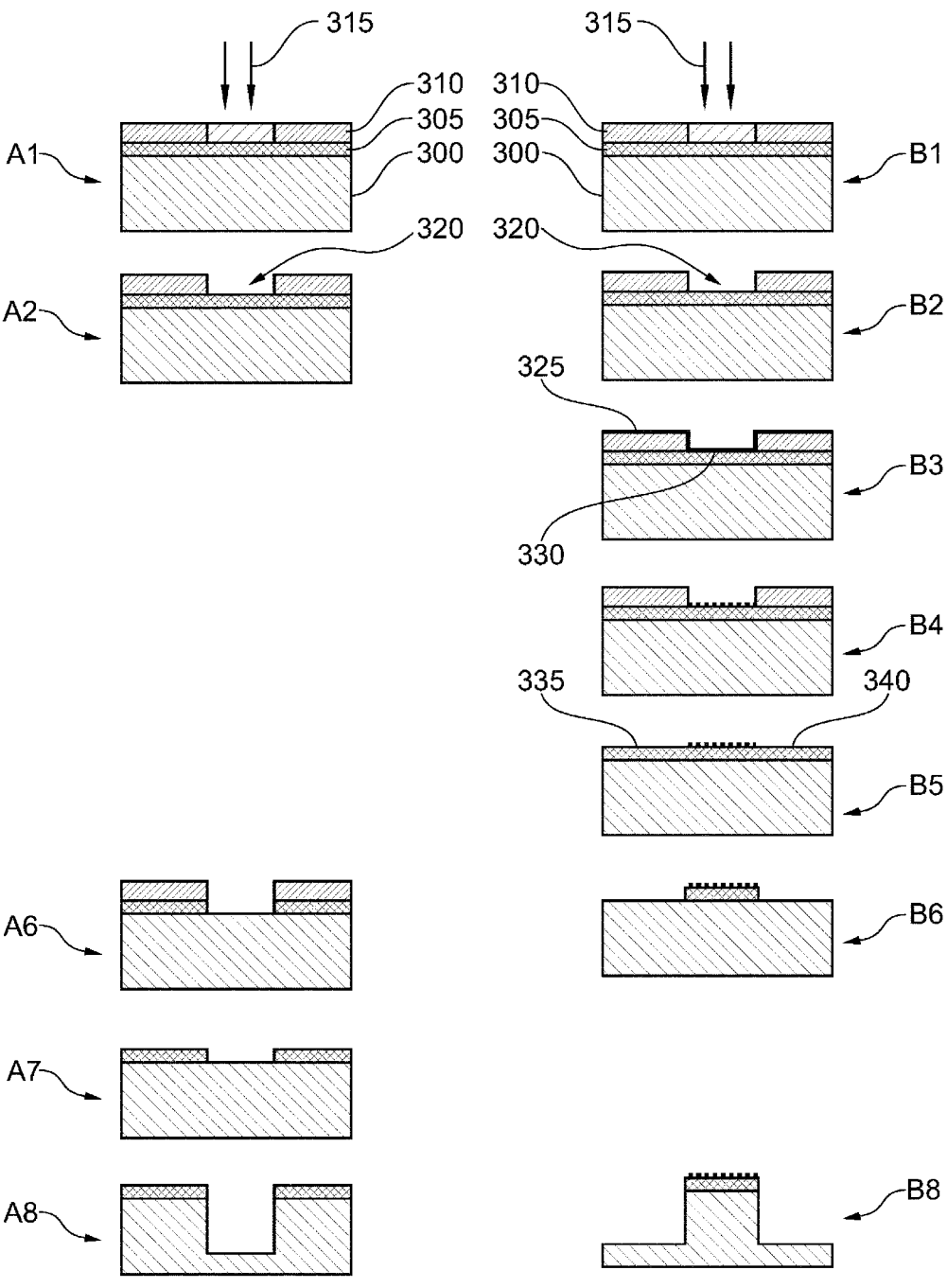

FIG. 3 shows a schematic representation of an exemplary embodiment of various process steps in the method of producing an etching mask, as described in the previous figures, compared to conventional process steps. The difference in the conventional structuring strategy is shown in the left-hand column A and the process steps of the method described in the previous figures of producing an etching mask for tonality reversal are shown in the right-hand column B. In both column A and column B, an identically shaped semi-finished product A1 and B1 are shown at the top of the figure shown herein. The semi-finished products A1 and B1 each comprise a substrate 300, which is merely by way of example a silicon wafer, the substrate 300 being coated in each case with a metal layer 305, which is merely by way of example a layer formed from chromium. A masking layer 310 is arranged on the metal layer 305 in each case, which in this exemplary embodiment is formed as a photo-positive resist layer. The semi-finished products A1 and B1 are shown during a step of structuring the masking layer, as described in the previous figures, and accordingly under the influence of an exposure 315.

By developing the exposed masking layer 310, structuring thereof is carried out, with the metal layer 305 being exposed at a processing region 320, as shown in the representation shown herein using semi-finished products A2 and B2. So far, neither the semi-finished products A1 and B1 nor the semi-finished products A2 and B2 show any difference from one another.

The difference in the production methods is only recognizable from the semi-finished product B3 shown in the right-hand column B. The semi-finished product B3 is coated along the masking layer 310 and in the processing region 320 along the metal layer 305 with an additional tetrel layer 325, which in this exemplary embodiment is formed from silicon and has a tetrel layer thickness of 10 nm, merely by way of example. Here, an interdiffusion zone 330 between the transition metal or optionally the aluminum and the tetrel is formed at the processing region 320 at an interface between the metal layer 305 and the tetrel layer 325.

In the figure shown here, a semi-finished product B4 after partial removal of the tetrel layer 325 is shown in the right-hand column B below the semi-finished product B3. Here, the tetrel layer 325 is selectively removed except for the interdiffusion zone 330, with no silicon flakes or fences remaining.

In the representation shown here, a semi-finished product B5, in which the masking layer 310 has been removed, is shown below the semi-finished product B4. The semi-finished product B5 still has the interdiffusion zone 330.

In the representation shown here, the semi-finished product B6 shown below the semi-finished product B5 is shown in contrast to a semi-finished product A6 shown in the left-hand column A. While on the semi-finished product A6 the substrate 300 is exposed exclusively in the processing region 320 by RIE etching with a resist mask, this is exactly the opposite for semi-finished product B6. Here, the substrate 300 is exposed in a first etching region 335 and a second etching region 340, while etching of the metal layer 305 in the processing region 320 has been avoided by the interdiffusion zone 330.

In the conventional structuring strategy shown in column A, the masking layer is only now removed, as shown in semi-finished product A7. Subsequently, a transfer of the pattern to the substrate 300 is probably possible, as shown in the semi-finished products A8 and B8. As a result, the semi-finished products A8 and B8 have a pattern with inverted tonality. Thus, in the conventionally produced semi-finished product A8, the pattern is introduced into the substrate 300 below the processing region 320, whereas in the semi-finished product B8 produced by the new production method presented in the previous figures, the pattern is introduced into the substrate 300 below the etching regions 335, 340. In other words, semi-finished product A8 shows a chromium etching with a thick resist mask compared to a very thin CrSi mask on semi-finished product B8, which avoids shading effects and charging effects at the resist edges.

Figure 4:
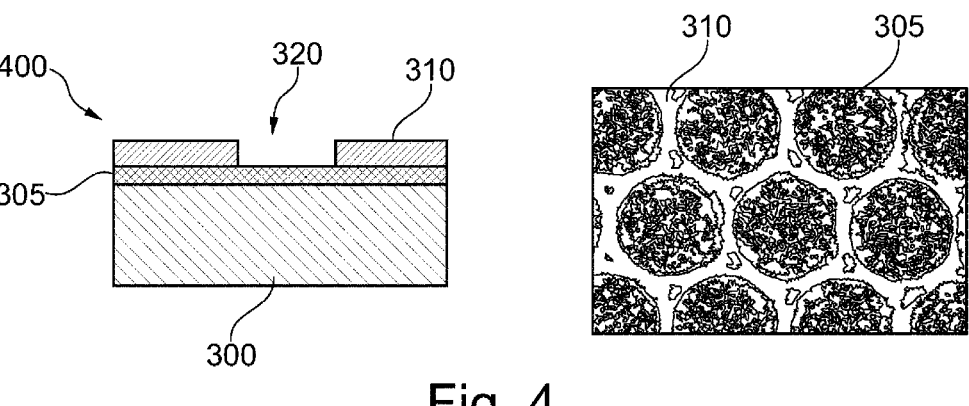

FIG. 4 shows a schematic representation of a structure 400 for producing an etching mask. The left-hand partial figure shows a cross-sectional view of the structure 400 and the right-hand partial figure shows a top view of the structure 400. The structure 400 is shown during the method step of structuring described in the previous FIGS. 1 and 2, and comprises a substrate 300 which is coated with a metal layer 305 and a structured masking layer 310. In the processing region 320, the metal layer 305 is exposed, resulting in flat shaped holes in the structure 400. In other words, this figure shows the resist pattern after development. Using the method for producing an etching mask described in the previous FIGS. 1 and 2, a pinhole array with 10$^{10}$ holes, which can also be referred to as pinholes, and a hexagonally shaped field of exemplary 600 nm was used as a demo pattern in this exemplary embodiment to test the process capability for critical CDs. UV exposure was performed with an i-line stepper.

Figure 5:
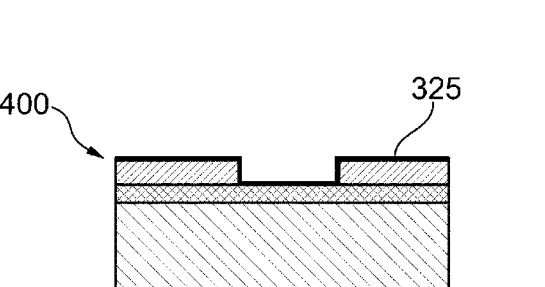
Figure 5:
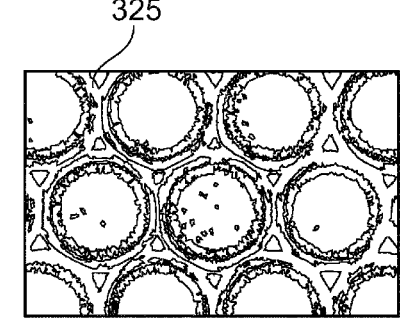

FIG. 5 shows a schematic representation of a structure 400 for producing an etching mask. The left-hand partial figure shows a cross-sectional view of the structure 400 and the right-hand partial figure shows a top view of the structure 400. The structure shown here corresponds to or is similar to the structure described in the previous FIG. 4, with the difference that the structure 400 shown here is coated with an additional tetrel layer 325. In other words, this figure shows the resist after coating with silicon.

Figure 6:
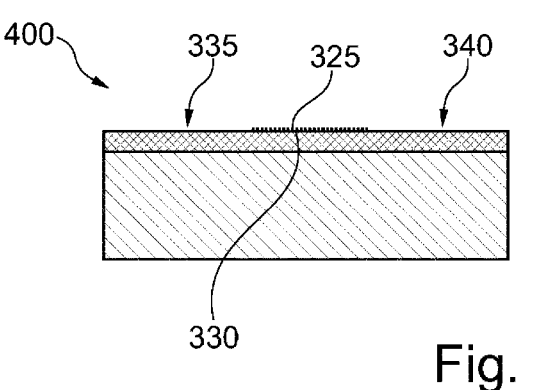
Figure 6:
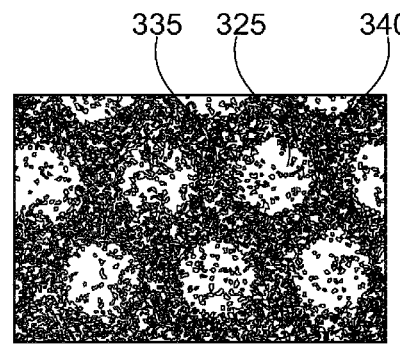

FIG. 6 shows a schematic representation of a structure 400 for producing an etching mask at the stage of an auxiliary mask. The left-hand partial figure shows a cross-sectional view of the structure 400 and the right-hand partial figure shows a top view of the structure 400. The structure shown here corresponds to or is similar to the structure described in the previous FIG. 4, with the difference that the masking layer is removed in the structure 400 shown here. Accordingly, the structure 400 has an interdiffusion zone 330 passivated with the tetrel layer 325, which is arranged between etching regions 335, 340 in which the metal layer is exposed. In other words, this figure shows a modified Cr surface after Si etching with KOH and resist strips. The surface modification shows a certain contrast in the SEM. The thickness of the modified zone is difficult to measure due to the Cr surface roughness, but the pinholes appear more like shallow holes than protrusions.

Figures 7, 8, 9:
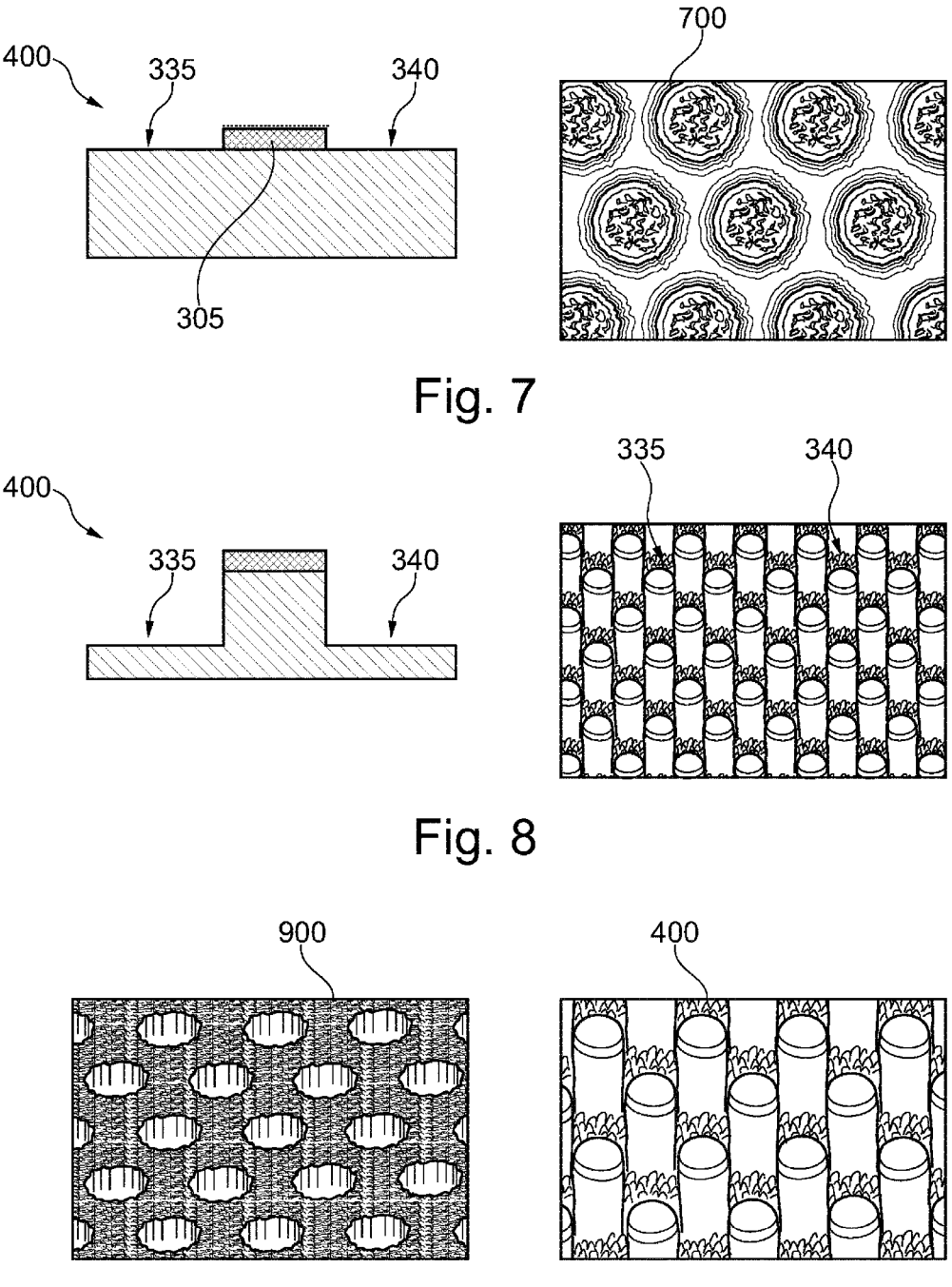

FIG. 7 shows a schematic representation of the etching mask produced. The left-hand partial figure shows a cross-sectional view of the structure 400 and the right-hand partial figure shows a top view of the structure 400 etched into the substrate. The structure shown here corresponds to or is similar to the structure described in the previous FIG. 4, with the difference that the metal layer 305 is removed at the etching regions. In other words, this figure shows the chromium after RIE-Cl etching. The result is a reduced Cr dot diameter. The right image of the tilted sample shows a kind of very thin underetched film 700 on the upper side of the Cr dots. This could be the remaining interdiffusion zone after underetching. The tonality inversion was created in this step.

FIG. 8 shows a schematic representation of the structure etched into the substrate with the etching mask. The left-hand partial figure shows a cross-sectional view of the structure 400 and the right-hand partial figure shows a top view of the structure 400 etched into the substrate. The structure shown here corresponds to or is similar to the structure described in the previous FIG. 4, with the difference that the substrate 300 below the etching regions 335, 340 is partially removed. A pattern transfer to the substrate by RIE-F etching is therefore shown. The proposed process was completed after transferring the pattern to the substrate using RIE-F. The thin layer residues from FIG. 7 have disappeared. This corresponds to the etching behavior of the interdiffusion zone in fluorine-based plasmas and the ToF-SIMS analysis.

FIG. 9 shows a perspective top view of a structure 400 etched into a substrate in comparison with another structure 900 etched into a substrate. Here, the further structure 900 was produced using a conventional process as described in the previous FIG. 3 and shows a conventional positive tone lithography and RIE with a hole mask. The structure 400 is the result of the method of producing an etching mask for tonality reversal described in the previous FIGS. 1 and 2. The same photomask and the same resist process were used to create structure 400 and the further structure 900. In order to visualize the results of the tonality reversal, it was compared with the patterns of conventional positive tone lithography. The same photomask was used for this. The images of the conventional process sequence show the samples after removal of the Cr etching mask. The Cr etching mask is still present in the samples with the inverted tonality. The increased bottom roughness is probably due to a special glass substrate that is known to have increased bottom roughness after RIE etching.

Figure 10:
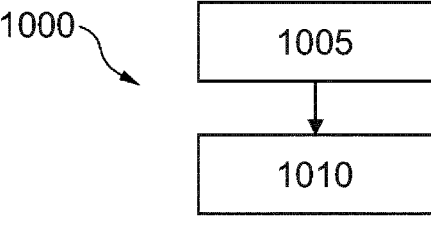

FIG. 10 shows a flowchart of an exemplary embodiment of a method 1000 for etching a structure into a substrate. The method comprises a step 1005 of producing an etching mask and a step 1010 of deep etching into the substrate using the etching mask. Merely by way of example, deep etching into the substrate is carried out by means of RIE or DRIE.

Figure 11:
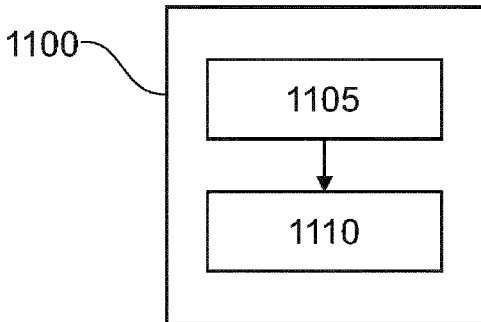

FIG. 11 shows a block diagram of an exemplary embodiment of a device 1100 for controlling a method for etching a structure into a substrate. The device comprises a production unit 1105 for controlling production of an etching mask and an etching unit 1110 for controlling deep etching. In another exemplary embodiment, the device 1100 may also be designed to control a method of producing an etching mask as described in the previous FIGS. 1 and 2.

Figure 12:
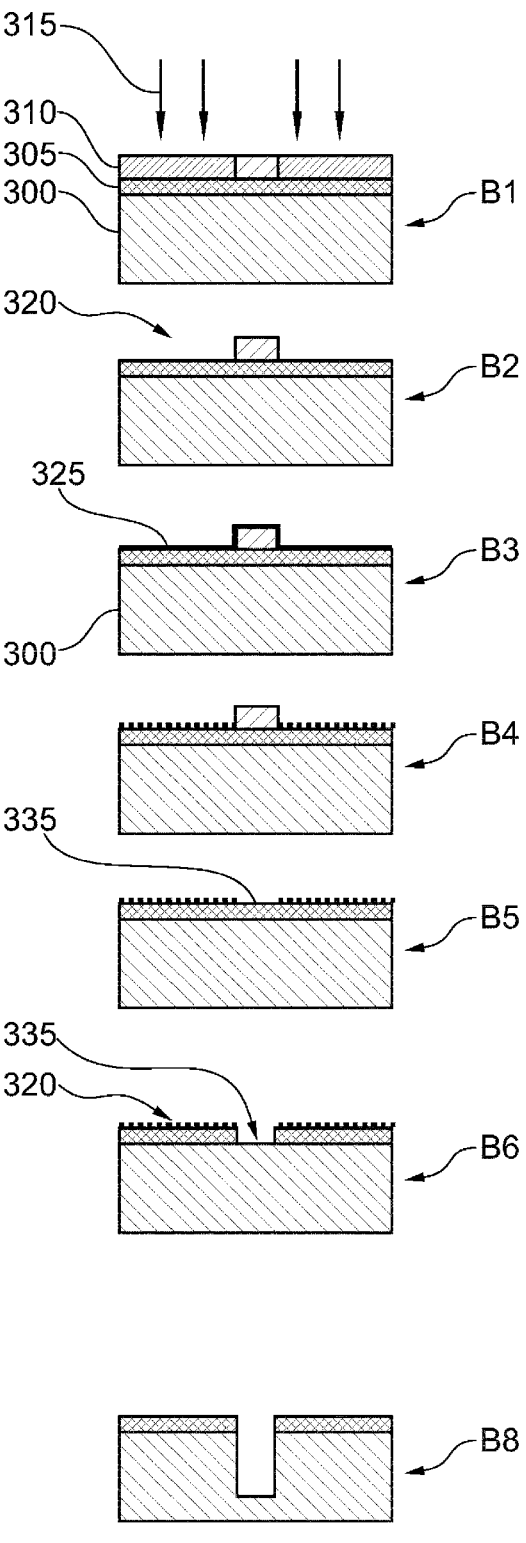
Figure 15:
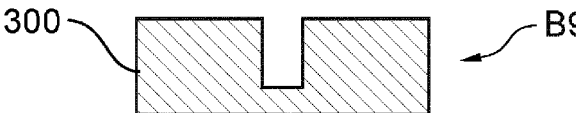
FIG. 15 shows a further process step.

FIG. 12 shows a schematic representation of an exemplary embodiment of various process steps in the method of producing an etching mask as described in the previous FIGS. 1 and 2. The representation corresponds to or is similar to the process steps in the right-hand column described in the previous FIG. 3. A particularly narrow trench is etched in the first etching region 335, as can be seen from the semi-finished products B6 and B8, particularly in comparison with the process steps shown in the left-hand column of the previous FIG. 3. FIG. 15 shows a modification of the exemplary embodiment in which the etching mask was subsequently removed after deep etching into the substrate, resulting in a semi-finished product or respectively end product B9 that is free of the metal layer.

Figure 13:
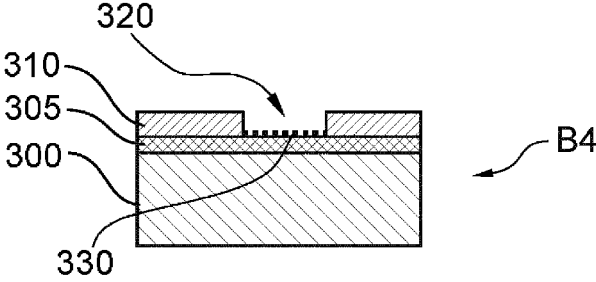
FIG. 13 shows a structure for producing an etching mask.

FIG. 13, as well as representation B4 from FIG. 3, shows a structure for producing a mask. The interdiffusion zone 330 shown in dashed lines is formed from an alloy of the transition metal or aluminum of the metal layer with a tetrel, preferably silicon, with the metal layer 310 being covered with the interdiffusion zone 330 in the processing region 320. The metal layer 305 is designed to be continuous, i.e., both inside and outside the processing region 320 on the substrate 300. In the processing region 320, the masking layer 310 is interrupted. Outside the processing region, the masking layer 310 is arranged directly on the metal layer 305, while the processing region 320 is free of material of the masking layer.

Figure 14:
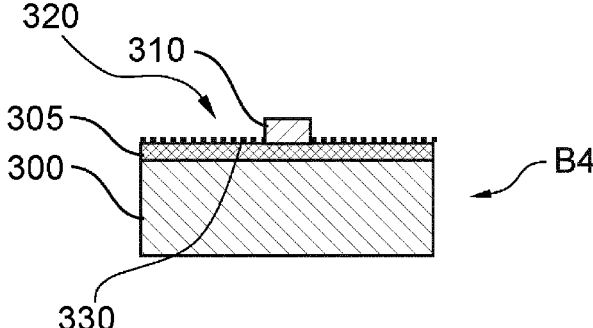
FIG. 14 shows another structure for producing an etching mask.

FIG. 14, as well as representation B4 from FIG. 12, shows a further structure for producing a mask. Here, the processing region 320 is shown with the interdiffusion zone 330 to the left and right of the masked region of the masking layer 310. Such a structure for producing a mask can hereafter be used to etch trenches into the substrate.

The invention claimed is:

1. A method-of producing an etching mask, the method-comprising:

providing a substrate;

applying a metal layer with a metal layer thickness to the substrate, wherein the metal layer comprises at least one transition metal and/or aluminum or is formed from such a metal;

applying at least one masking layer with a masking layer thickness to the substrate coated with the metal layer;

structuring the masking layer, wherein the metal layer is exposed in at least one processing region;

subsequent of structuring the masking layer, coating of the substrate with a tetrel layer with a tetrel layer thickness, with the tetrel layer including at least partially a tetrel, wherein an interdiffusion zone is formed at the processing region at an interface between the metal layer and the tetrel layer, wherein the tetrel layer-comprises silicon or is formed from silicon and wherein the interdiffusion zone is present as a transition metal silicide layer or an aluminum silicide layer;

removing the masking layer; and selectively etching the metal layer, wherein the substrate is exposed in at least one etching region other than the processing region, and the metal layer is at least partially maintained in the processing region.

2. The method according to claim 1, comprising a step of removing the tetrel layer, wherein the interdiffusion zone remains at the processing region, wherein removing the tetrel layer is carried out after the step of coating and before the step of removing, and/or wherein in the step of removing the masking layer the tetrel layer is at least partially removed.

3. The method according to claim 2, wherein removing the tetrel layer is carried out wet-chemically using KOH and/or NaOH and/or $NH_4OH$ and/or an organic basic etching agent.

4. The method according to claim 1, wherein in step of structuring, the masking layer is structured by exposing and developing and/or by means of an electron beam.

5. The method according to claim 1, wherein in step of removing, the masking layer-is removed by ashing and/or wet-chemically and/or by dissolving in a solvent and/or by a combination of dissolving and chemical removal, and/or wherein in step of selectively etching, etching of the metal layer is carried out by means of reactive ion beam etching (RIE) and/or non-reactive ion beam etching and/or wet-chemically with an acidic and/or halogen-containing etching agent.

6. The method according to claim 1, wherein in step of applying the metal layer-consists of Ti, Zr, Ta, Cr, Mo and/or W or comprises at least one of these metals, and/or in step of providing the substrate is provided as a wafer of glass, quartz glass, quartz single crystal, Si, Ge, BiTe, GaAs, SiC, InP, GaInAsP or a polymer.

7. The method according to claim 1, wherein the metal layer thickness is between 1 nm and 2000 nm, and/or the masking layer thickness is between 1 nm and 500 nm, and/or the tetrel layer thickness is between 1 nm and 30 nm.

8. The method according to claim 1, wherein in step of applying the metal layer is applied by means of sputtering or vapor deposition, and/or that in step of coating the substrate is coated with the tetrel layer by means of sputtering or vapor deposition.

9. The method according to claim 1, comprising a step of cleaning the surface of the exposed processing region, wherein the step of cleaning is performed after the step of structuring and before the step of coating.

10. The method according to claim 1, wherein the tetrel layer is used when producing an auxiliary mask inverted with respect to a resist mask, wherein the inverted auxiliary mask masks the metal layer, wherein the metal layer comprises a transition metal and/or aluminum, and the auxiliary mask is formed from an alloy of the tetrel with the metal comprising a metal silicide.

11. A method of etching a structure into a substrate, the method comprising the following steps:

producing an etching mask according to claim 1; and deep etching into the substrate using the etching mask.

12. The method according to claim 11, wherein the deep etching into the substrate is carried out by means of RIE or DRIE.

13. The method according to claim 11, further comprising removing the etching mask simultaneously with the deep etching into the substrate and/or after the deep etching into the substrate.

14. A device configured to perform and/or control the steps of the method according to claim 1 in corresponding units.

* * * * *